United States Patent
Liu

(10) Patent No.: US 9,847,790 B2
(45) Date of Patent: Dec. 19, 2017

(54) HYBRID ANALOG-TO-DIGITAL CONVERTER USING DIGITAL SLOPE ANALOG-TO-DIGITAL CONVERTER AND RELATED HYBRID ANALOG-TO-DIGITAL CONVERSION METHOD THEREOF

(71) Applicant: MEDIATEK INC., Hsin-Chu (TW)

(72) Inventor: Chun-Cheng Liu, Changhua County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/506,234

(22) PCT Filed: Aug. 27, 2015

(86) PCT No.: PCT/CN2015/088249
§ 371 (c)(1),
(2) Date: Feb. 23, 2017

(87) PCT Pub. No.: WO2016/029858
PCT Pub. Date: Mar. 3, 2016

(65) Prior Publication Data
US 2017/0244424 A1 Aug. 24, 2017

Related U.S. Application Data

(60) Provisional application No. 62/042,886, filed on Aug. 28, 2014.

(51) Int. Cl.
*H03M 1/38* (2006.01)
*H03M 1/54* (2006.01)

(52) U.S. Cl.
CPC ............... *H03M 1/38* (2013.01); *H03M 1/54* (2013.01)

(58) Field of Classification Search
CPC ........ H03M 1/38; H03M 1/54; H03M 1/0863; H03M 1/466; H03M 1/56
(Continued)

(56) References Cited

U.S. PATENT DOCUMENTS 7,205,921 B1 * 4/2007 Savla ................... H03M 1/145
341/155
7,812,757 B1 10/2010 Wong
(Continued)

FOREIGN PATENT DOCUMENTS

CN 101807923 A 8/2010
CN 102045067 A 5/2011
(Continued)

OTHER PUBLICATIONS

Chun-Cheng Liu, "A 10-bit 320-MS/s Low-Cost SAR ADC for IEEE 802.11ac Applications in 20-nm CMOS", Nov. 10-12, 2014, pp. 77-80, IEEE Asian Solid-State Circuits Conference.
Dong-Young Chang et al., "A 21mW 15b 48MS/s Zero-Crossing Pipeline ADC in 0.13um CMOS with 74dB SNDR", Feb. 11, 2014, pp. 204-205 and Figure 11.6.7, ISSCC 2014 / Session 11 / Data Converter Techniques / 11.6, 2014 IEEE International Solid-State Circuits Conference.
(Continued)

*Primary Examiner* — Khai M Nguyen
(74) *Attorney, Agent, or Firm* — Winston Hsu

(57) ABSTRACT

A hybrid analog-to-digital converter (ADC) includes a plurality of analog-to-digital conversion circuits and a combining circuit. The analog-to-digital conversion circuits generate a plurality of partial digital outputs for a same analog input, respectively, wherein the analog-to-digital conversion circuits include a digital slope ADC used to perform signal quantization in a time domain. The combining circuit combines the partial digital outputs generated from the analog-to-digital conversion circuits to generate a final digital output of the analog input.

20 Claims, 5 Drawing Sheets

(58) Field of Classification Search
USPC .................. 341/155, 156, 161, 163, 172
See application file for complete search history.

(56) References Cited

U.S. PATENT DOCUMENTS

| | | | |
|---|---|---|---|
| 8,492,697 B2* | 7/2013 | Neubauer | H03M 1/145 |
| | | | 250/208.1 |
| 8,581,761 B1* | 11/2013 | Bahukhandi | H03M 1/0863 |
| | | | 341/118 |
| 8,933,385 B2 | 1/2015 | Wang | |
| 2012/0154194 A1 | 6/2012 | Chang | |
| 2013/0341489 A1 | 12/2013 | Yoshida | |

FOREIGN PATENT DOCUMENTS

| | | |
|---|---|---|
| CN | 102611854 A | 7/2012 |
| CN | 103516365 A | 1/2014 |
| CN | 103532558 A | 1/2014 |

OTHER PUBLICATIONS

Bob Verbruggen et al., "A 70 dB SNDR 200 MS/s 2.3 mW dynamic pipelined SAR ADC in 28nm digital CMOS", 2014, 2014 Symposium on VLSI Circuits Digest of Technical Papers.

Frank Van Der Goes et al., "A 1.5mW 68dB SNDR 80MS/s 2 x Interleaved SAR-Assisted Pipelined ADC in 28nm CMOS", Feb. 11, 2014, p. 200-201 and Figure 11.4.7, ISSCC 2014 / Session 11 / Data Converter Techniques / 11.4, 2014 IEEE International Solid-State Circuits Conference.

Yuan Zhou et al., "A 12b 160MS/s Synchronous Two-Step SAR ADC Achieving 20.7fJ/step FoM with Opportunistic Digital Background Calibration", 2014, 2014 Symposium on VLSI Circuits Digest of Technical Papers.

"International Search Report" dated Nov. 25, 2015 for International application No. PCT/CN2015/088249, International filing date: Aug. 27, 2015.

* cited by examiner

HYBRID ANALOG-TO-DIGITAL CONVERTER USING DIGITAL SLOPE ANALOG-TO-DIGITAL CONVERTER AND RELATED HYBRID ANALOG-TO-DIGITAL CONVERSION METHOD THEREOF

CROSS REFERENCE TO RELATED APPLICATIONS

This application claims the benefit of U.S. provisional application No.62/042,886, filed on Aug. 28, 2014 and incorporated herein by reference.

TECHNICAL FIELD

The disclosed embodiments of the present invention relate to converting an analog input into a digital output, and more particularly, to a hybrid analog-to-digital converter (ADC) using a digital slope ADC and a related hybrid analog-to-digital conversion method thereof.

BACKGROUND

A successive approximation register analog-to-digital converter (SAR ADC) is a type of analog-to-digital converter that converts a continuous analog waveform into a discrete digital representation by a search scheme. One of the most common implementations of SAR ADC, the switched-capacitor (or charge-redistribution) SAR ADC, uses a switched-capacitor network composed of a plurality of capacitors. The capacitors are individually switched on the basis of the search scheme for obtaining the approximation of the analog input.

In recent years, the operation speed of SAR ADCs has been improved with the scaling of complementary metal oxide semiconductor (CMOS) technology. SAR ADCs may achieve a few hundreds mega-samples per second (MS/s) with 8-bit to 10-bit resolution. The signal-to-noise ratio (SNR) of high-speed SAR ADCs is mainly dominated by comparator noise and usually limited to 50 dB-60 dB. The power consumption of the comparator may be increased exponentially to thereby suppress the comparator noise in a limited comparison time to improve the SNR. Concerning the conventional noise-tolerant SAR ADC, it reduces comparator power in first bit-cycles by using a coarse comparator, but the fine comparator in the remaining bit-cycles still consumes significant power to achieve an SNR more than 60 dB. Concerning the conventional SAR-assisted pipelined ADC, it can release the requirement of a low noise comparator, but will induce gain errors between inter-stages. The gain calibration increases the design complexity. Further, the amplifier and back-end stages result in extra noise and area to the ADCs. Concerning the conventional fully-differential digital slope ADC, it is inherently low-noise due to quantizing the signal in the time domain, but the hardware grows exponentially with resolution and the maximum conversion rate is halved with each additional bit of resolution. Hence, this conventional fully-differential digital slope ADC is unattractive for resolution higher than 8 bits.

Thus, there is a need for an innovative ADC design which is capable of achieving lower power consumption, lower noise, and higher resolution.

SUMMARY

In accordance with exemplary embodiments of the present invention, a hybrid analog-to-digital converter (ADC) using a digital slope ADC and a related hybrid analog-to-digital conversion method thereof are proposed.

According to a first aspect of the present invention, an exemplary hybrid analog-to-digital converter (ADC) is disclosed. The exemplary hybrid ADC includes a plurality of analog-to-digital conversion circuits and a combining circuit. The analog-to-digital conversion circuits are arranged to generate a plurality of partial digital outputs for a same analog input, respectively, wherein the analog-to-digital conversion circuits comprise a digital slope ADC arranged to perform signal quantization in a time domain. The combining circuit is arranged to combine the partial digital outputs generated from the analog-to-digital conversion circuits to generate a final digital output of the analog input.

According to a second aspect of the present invention, an exemplary hybrid analog-to-digital conversion method is disclosed. The exemplary hybrid analog-to-digital conversion method includes: performing a plurality of analog-to-digital conversions to generate a plurality of partial digital outputs for a same analog input, respectively, wherein the analog-to-digital conversions comprise a digital slope analog-to-digital conversion arranged to perform signal quantization in a time domain; and combining the partial digital outputs generated from the analog-to-digital conversions to generate a final digital output of the analog input.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The main concept of the present invention is to combine different ADC structures to create a hybrid ADC with benefits offered by the different ADC structures. For example, the present invention may propose a 12-bit hybrid ADC combining a 7-bit low-power SAR coarse ADC with a 6-bit low-noise digital slope fine ADC. The proposed hybrid ADC may be a 100 MS/s SAR-assisted digital slope ADC implemented using a 28 nm CMOS technology, and may achieve 64.43 dB signal-to-noise-and-distortion ratio (SNDR) at Nyquist input with only 0.35 mW power consumption from a 0.9V supply. Hence, compared to state-of-the-art ADCs, the proposed hybrid ADC may have small chip area, low power consumption, low noise, and high resolution. Further details of the proposed hybrid ADC are described as below.

Figure 1:
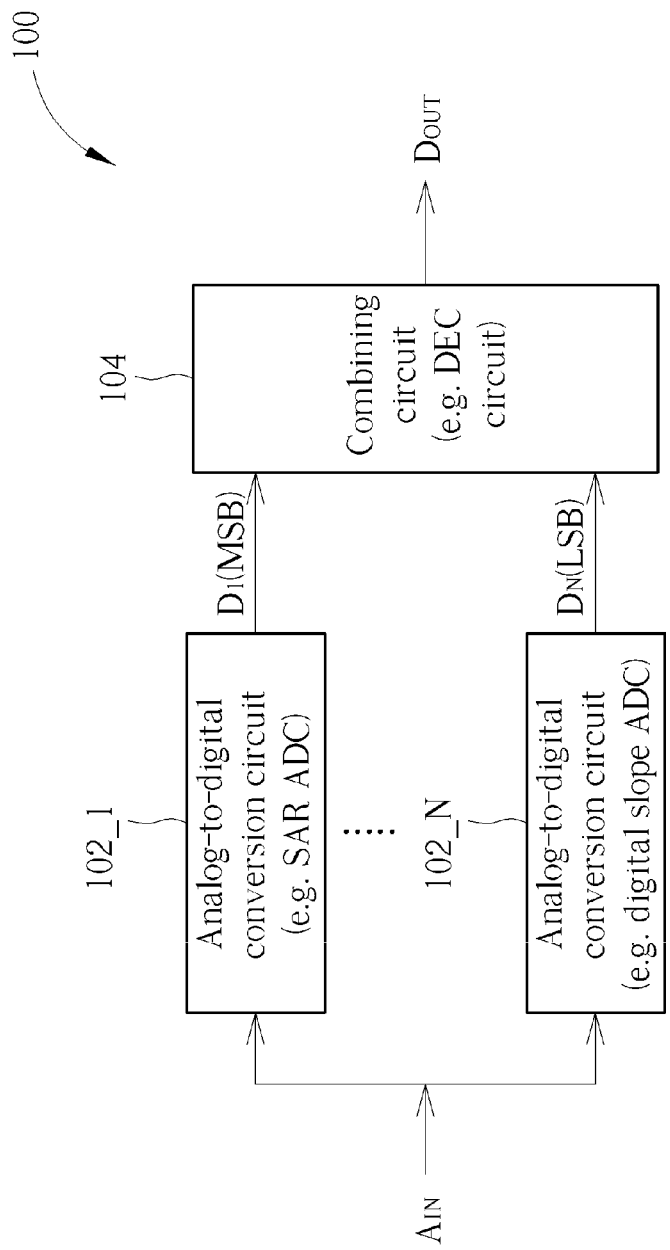
FIG. 1 is a block diagram illustrating a generalized hybrid analog-to-digital converter (ADC) according to an embodiment of the present invention.

FIG. 1 is a block diagram illustrating a generalized hybrid analog-to-digital converter (ADC) according to an embodiment of the present invention. The hybrid ADC 100 includes a plurality of analog-to-digital conversion circuits 102_1-102_N and a combining circuit 104. The number of analog-to-digital conversion circuits 102_1-102_N may be adjusted, depending upon actual design considerations. For example, the hybrid ADC 100 may be configured to have two analog-to-digital conversion circuits 102_1-102_N, where N=2. The analog-to-digital conversion circuits 102_1-102_N are arranged to generate a plurality of partial digital outputs $D_1$-$D_N$ for the same analog input $A_{IN}$, respectively. In this embodiment, the analog-to-digital conversion circuits 102_1-102_N include analog-to-digital conversion circuits implemented using different ADC structures. For example, the analog-to-digital conversion circuit 102_1 may be a successive approximation register (SAR) ADC such as a switched-capacitor (or charge-redistribution) SAR ADC; and the analog-to-digital conversion circuit 102_N may be a digital slope ADC arranged to perform signal quantization in the time domain. In one exemplary design, the SAR ADC may be a coarse ADC arranged to determine most significant bits (MSBs) corresponding to the analog input $A_{IN}$, and the digital slope ADC may be a fine ADC arranged to determine least significant bits (LSBs) corresponding to the analog input $A_{IN}$. Since the SAR ADC may employ a coarse comparator with reduced power consumption, the hybrid ADC 100 therefore gets the low-power feature from the use of the SAR coarse ADC. Further, since the digital slope ADC is inherently a low-noise ADC, the hybrid ADC 100 therefore gets the low-noise feature from the use of the digital slope fine ADC.

The combining circuit 104 is arranged to combine the partial digital outputs $D_1$-$D_N$ generated from the analog-to-digital conversion circuits 102_1-102_N to generate a final digital output $D_{OUT}$ of the analog input $A_{IN}$. In a case where at least one of the analog-to-digital conversion circuits 102_1-102_N is configured to generate a partial digital output with redundancy, the combining circuit 104 may be implemented using a digital error correction (DEC) circuit to convert a J-bit redundant code (which is composed of partial digital outputs $D_1$-$D_N$) into a K-bit binary code acting as the final digital output $D_{OUT}$, where K<J.

Figure 2:
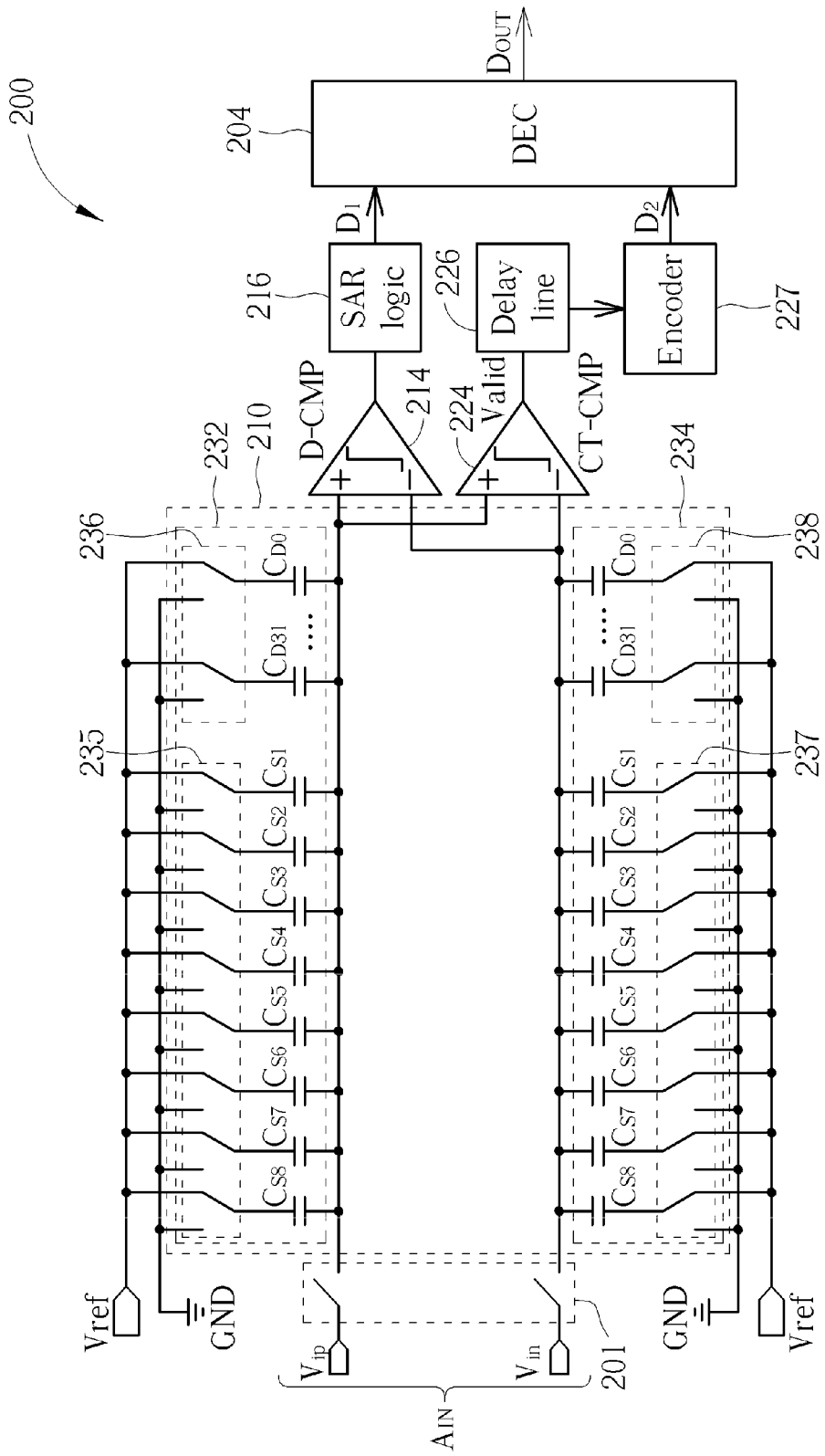
FIG. 2 is a diagram illustrating one exemplary implementation of a hybrid ADC based on the proposed hybrid ADC structure shown in FIG. 1.

FIG. 2 is a diagram illustrating one exemplary implementation of a hybrid ADC based on the proposed hybrid ADC structure shown in FIG. 1. In this exemplary implementation, the hybrid ADC 200 includes one combining circuit implemented using a digital error correction circuit (denoted by "DEC") 204, and further includes two analog-to-digital conversion circuits implemented using an SAR ADC and a digital slope ADC. The SAR ADC includes a switched-capacitor network 210, a dynamic comparator (denoted as "D-CMP") 214, and an SAR logic 216. The digital slope ADC includes a continuous-time comparator (denoted as "CT-CMP") 224, a delay line 226, an encoder (e.g., thermometer-to-binary encoder) 227, and the switched-capacitor network 210.

In this exemplary implementation, the SAR ADC is configured to serve as a coarse ADC arranged to determine MSBs corresponding to the analog input $A_{IN}$ (which is a differential input composed of a positive input Vip and a negative input Vin), and the digital slope ADC is configured to serve as a fine ADC arranged to determine LSBs corresponding to the same analog input $A_{IN}$ (which is a differential input composed of a positive input Vip and a negative input Vin). It should be noted that analog-to-digital conversions performed by the SAR ADC and the digital slope ADC share the same switched-capacitor network 210, such that there is no gain error between the SAR ADC and the digital slope ADC. Hence, the proposed hybrid ADC 200 does not need any gain calibration.

As shown in FIG. 2, the shared switched-capacitor network 210 includes a first switched-capacitor sub-network 232 and a second switched-capacitor sub-network 234. The first switched-capacitor sub-network 232 is coupled to a positive input terminal (+) of the D-CMP 214 of the SAR ADC and a positive input terminal (+) of the CT-CMP 224 of the digital slope ADC. The second switched-capacitor sub-network 234 is coupled to a negative input terminal (−) of the D-CMP 214 of the SAR ADC and a negative input terminal (−) of the CT-CMP 224 of the digital slope ADC.

The first switched-capacitor sub-network 232 and the second switched-capacitor sub-network 234 have the same circuit structure. For example, each of the first switched-capacitor sub-network 232 and the second switched-capacitor sub-network 234 is configured to have a plurality of capacitors $C_{S1}$-$C_{S8}$ and $C_{D0}$-$C_{D31}$. Concerning the first switched-capacitor sub-network 232, the bottom plates of the capacitors $C_{S1}$-$C_{S8}$ are reset to one of the reference voltage Vref and the ground voltage GND under control of one switch circuit 235, and the bottom plates of the capacitors $C_{D0}$-$C_{D31}$ are reset to one of the reference voltage Vref and the ground voltage GND under control of the other switch circuit 236. Concerning the second switched-capacitor sub-network 234, the bottom plates of the capacitors $C_{S1}$-$C_{S8}$ are reset to one of the reference voltage Vref and the ground voltage GND under control of one switch circuit 237, and the bottom plates of the capacitors $C_{D0}$-$C_{D31}$ are reset to one of the reference voltage Vref and the ground voltage GND under control of the other switch circuit 238. The analog input $A_{IN}$ will be sampled at top plates of the capacitors $C_{S1}$-$C_{S8}$ and $C_{D0}$-$C_{D31}$ during a sampling phase.

It should be noted that the number of capacitors implemented in each of the first switched-capacitor sub-network 232 and the second switched-capacitor sub-network 234 may be adjusted, depending upon resolution of the hybrid ADC 200 (particularly, resolution of the SAR ADC and resolution of the digital slope ADC). Considering a case where a proposed hybrid ADC may be a Z-bit ADC combining an X-bit low-power SAR coarse ADC and a Y-bit low-noise digital slope fine ADC with/without time-domain interpolation, (X+1) capacitors may be needed in each of the first switched-capacitor sub-network 232 and the second switched-capacitor sub-network 234 to perform capacitor switching controlled by a search algorithm of the SAR ADC, and $2^P$ unit capacitors may be needed in each of the first switched-capacitor sub-network 232 and the second switched-capacitor sub-network 234 to perform capacitor switching controlled by a search algorithm of the digital slope ADC, where Z=X+Y−1 (there is 1-bit overlapped between SAR ADC and digital slope ADC output code) and P≤Y. For example, the hybrid ADC 200 shown in FIG. 2 may be a 12-bit ADC combining a 7-bit low-power SAR coarse ADC and a 6-bit low-noise digital slope fine ADC with time-domain interpolation, or may be an 11-bit ADC combining a 7-bit low-power SAR coarse ADC and a 5-bit low-noise digital slope fine ADC without time-domain interpolation. Hence, 8 capacitors $C_{S1}$-$C_{S8}$ may be needed to perform capacitor switching controlled by the search algorithm of the SAR ADC, and 32 capacitors $C_{D0}$-$C_{D31}$ may be needed to perform capacitor switching controlled by the search algorithm of the digital slope ADC.

In one exemplary design, each of the unit capacitors $C_{D0}$-$C_{D31}$ has the same unit capacitance value C (e.g., 0.8 fF), and each of the capacitors $C_{S1}$-$C_{S8}$ has a capacitance value larger than the unit capacitance value C. For example, the capacitor weights of the capacitors $C_{S8}$:$C_{S7}$:$C_{S6}$:$C_{S5}$:$C_{S4}$:$C_{S3}$:$C_{S2}$:$C_{S1}$:$C_{D31}$:~:$C_{D0}$ may be 480:256:128:64:40:24:16:8:1:~:1. However, this is for illustrative purposes only, and is not meant to be a limitation of the present invention.

To reduce the switching power, the proposed switched-capacitor (or charge-redistribution) SAR ADC may be configured to adopt, for example, a monotonic switching procedure disclosed in a non-patent literature, C. C. Liu et al., "A 10-bit 50-MS/s SAR ADC with a Monotonic Capacitor Switching Procedure," IEEE Journal of Solid-State Circuits, vol. 45, no. 4, pp. 731-740, April 2010, which is incorporated herein by reference. Further, the proposed digital slope ADC may adopt atime-domain signal quantization concept disclosed in a non-patent literature, P. Harpe et al., "A 0.8-mW 5-bit 250-MS/s Time-Interleaved Asynchronous Digital Slope ADC," IEEE Journal of Solid-State Circuits, vol. 46, no. 11, pp. 2450-2457, November 2011, which is also incorporated herein by reference. However, in contrast to the conventional fully-differential digital slope ADC, the proposed digital slope ADC is configured to operate in a pseudo-differential mode to reduce the overall capacitor count as well as the power consumption. Further, the proposed digital slope ADC may be configured to adopt time-domain interpolation to improve the resolution without adding extra unit capacitors.

Since the switched-capacitor network 210 is shared by the SAR ADC and the digital slope ADC, the switched-capacitor network 210 should be properly controlled to achieve respective analog-to-digital conversion functions of the SAR ADC and the digital slope ADC. For example, during the analog-to-digital conversion performed by the SAR ADC, the switch circuits 235 and 237 may be active to dynamically adjust the connection configuration associated with bottom plates of capacitors $C_{S1}$-$C_{S8}$ in the first switched-capacitor sub-network 232 and the second switched-capacitor sub-network 234, while the switch circuits 236 and 238 may be inactive to keep the initial connection configuration associated with bottom plates of capacitors $C_{D0}$-$C_{D31}$ in the first switched-capacitor sub-network 232 and the second switched-capacitor sub-network 234 unchanged. In addition, during the analog-to-digital conversion performed by the digital slope ADC, the switch circuits 235 and 237 may be inactive to keep the final connection configuration associated with bottom plates of capacitors $C_{S1}$-$C_{S8}$ in the first switched-capacitor sub-network 232 and the second switched-capacitor sub-network 234 unchanged and the switch circuit 238 may be inactive to keep a level-shift connection configuration associated with bottom plates of capacitors $C_{D0}$-$C_{D31}$ in the second switched-capacitor sub-network 234 unchanged, while the switch circuit 236 may be active to dynamically adjust the connection configuration associated with bottom plates of capacitors $C_{D0}$-$C_{D31}$ in the first switched-capacitor sub-network 232. Further details of the hybrid ADC 200 are described as below.

The hybrid ADC 200 employs the SAR ADC as a coarse ADC and employs a digital slope ADC as a fine ADC. Hence, with regard to one analog-to-digital conversion for generating one final 12-bit digital output $D_{OUT}$, the digital slope conversion procedure is performed after the SAR conversion procedure is done. At the beginning of an SAR conversion procedure, the hybrid ADC 200 samples the analog input $A_{IN}$ (which is a differential input composed of a positive input Vip and a negative input Vin) on top plates of all capacitors $C_{S1}$-$C_{S8}$ and $C_{D0}$-$C_{D31}$ included in the switched-capacitor network 210 via a bootstrapped switch 201, which increases the settling speed and input bandwidth. At the same time, the bottom plates of all capacitors $C_{S1}$-$C_{S8}$ and $C_{D0}$-$C_{D31}$ included in the switched-capacitor network 210 are reset to the reference voltage Vref. In other words, the initial connection configuration associated with bottom plates of capacitors $C_{S1}$-$C_{S8}$ and $C_{D0}$-$C_{D31}$ in the first switched-capacitor sub-network 232 and the second switched-capacitor sub-network 234 defines that the bottom plates of capacitors $C_{S1}$-$C_{S8}$ and $C_{D0}$-$C_{D31}$ are all connected to the reference voltage Vref through the switch circuits 235-238.

Next, the monotonic switching procedure is active to sequentially control the connection configuration of the bottom plate of each capacitor $C_{S8} \rightarrow C_{S7} \rightarrow \ldots \rightarrow C_{S2} \rightarrow C_{S1}$ in the first switched-capacitor sub-network 232 and the connection configuration of the bottom plate of each capacitor $C_{S8} \rightarrow C_{S7} \rightarrow \ldots \rightarrow C_{S2} \rightarrow C_{S1}$ in the second switched-capacitor sub-network 234 according to the comparator output generated by the D-CMP 214 in each bit-cycle. Hence, at the end of the SAR conversion procedure, the SAR logic 216 outputs a recorded 7-bit binary code to the digital error correction circuit 204 to serve as the partial digital output D1 (which is a coarse ADC output) needed to determine the final digital output $D_{OUT}$.

When the SAR conversion procedure finishes, the digital slope conversion procedure is started under a condition that the final connection configuration of bottom plates of capacitors $C_{S8}$-$C_{S1}$ in the first switched-capacitor sub-network 232 and the second switched-capacitor sub-network 234 is set by the SAR conversion procedure. In this exemplary implementation, the digital slope ADC may be configured to operate in a pseudo-differential mode rather than a fully-differential mode. Hence, at the beginning of the digital slope conversion procedure, a portion of the unit capacitors $C_{D0}$-$C_{D31}$ in the second switched-capacitor sub-network 234 (e.g., one half of the unit capacitors $C_{D0}$-$C_{D31}$ at the negative input terminal (−) of the CT-CMP 224) are controlled to switch from the reference voltage Vref to the ground voltage GND, thereby applying a level-shift operation upon a residue voltage remaining at the end of the SAR conversion procedure. For example, bottom plates of the capacitors $C_{D0}$-$C_{D15}$ in the second switched-capacitor sub-network 234 may be reset to the ground voltage GND, while bottom plates of the remaining capacitors $C_{D16}$-$C_{D31}$ in the second switched-capacitor sub-network 234 may be kept at the reference voltage Vref. The level-shift operation ensures that the residue voltage is located in the middle half operation range of the digital slope ADC. At this moment, the CT-CMP 224 is enabled and its comparator output Valid is initially low (i.e., Valid="0").

After the level-shifted residue voltage is well-settled, the delay line 226 is enabled to transmit a control signal to switch bottom plates of the capacitors $C_{D31}$-$C_{D0}$ in the first switched-capacitor sub-network 232 from the reference voltage Vref to the ground voltage GND in a sequence with an interval set by a delay time (e.g., 100 ps). In other words, the residue voltage is switched down one LSB by one LSB according to a capacitor switching frequency $$\left(\text{e.g.}, \frac{1}{100 \text{ ps}}\right).$$

When the residue voltage goes down to be smaller than zero (i.e., zero-crossing occurs due to the voltage at the positive input terminal (+) of the CT-CMP 224 being smaller than the voltage at the negative input terminal (−) of the CT-CMP 224), the comparator output Valid will rise from a logic low level to a logic high level (i.e., Valid="1") and disable the delay line 226 and stop the digital slope ADC. At this moment, the time-domain information in delay cells of the delay line 226 is sampled to generate a thermometer code to the encoder 227. Next, the encoder 227 converts the thermometer code into a binary code, and outputs the binary code as the partial digital output D2 needed to determine the final digital output $D_{OUT}$.

The digital slope fine ADC may be configured to generate the partial digital output D2 with one bit redundancy overlapped with the partial digital output D1 generated from the SAR coarse ADC. Hence, a Z-bit hybrid ADC output may be determine by an X-bit SAR ADC output and a Y-bit digital slope ADC output, where Z=X+Y−1. As mentioned above, the level-shift operation ensures that the residue voltage is located in the middle half operation range of the digital slope ADC. Hence, there is a redundancy range in a full operation range of the digital slope ADC. To obtain the correct output, the digital error correction circuit 204 is required to properly combine the digital outputs D1 and D2 and further subtract an offset induced by the redundancy range from the combination result. For example, when a digital slope fine ADC implemented in the proposed hybrid ADC is a 6-bit digital slope ADC with time-domain interpolation or a 5-bit digital slope ADC without time-domain interpolation, there may be a 16-LSB/8-LSB redundant range with/without time-domain interpolation. For better understanding of technical features of the proposed hybrid ADC, one operation example is provided as below.

Figure 3:
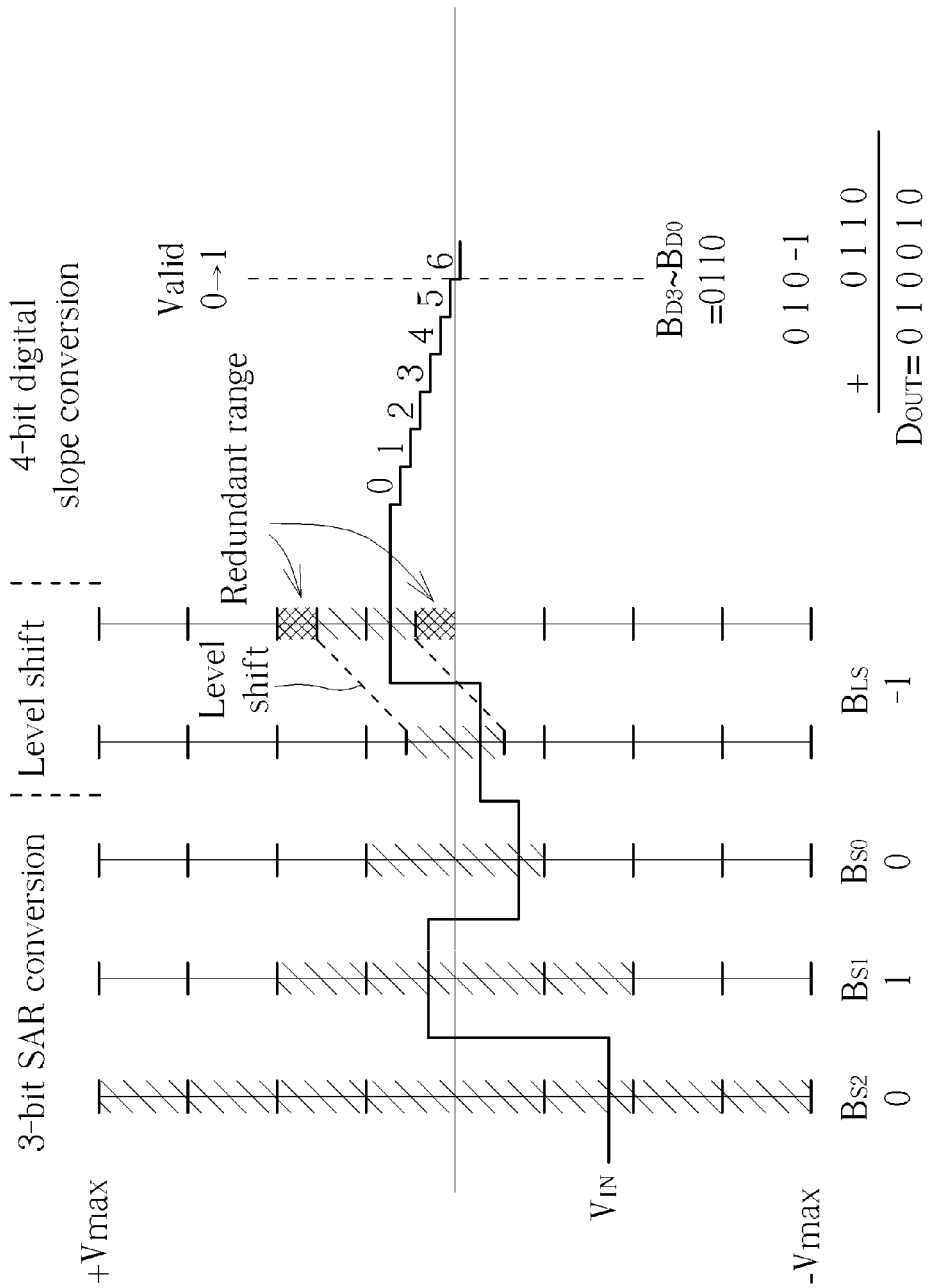
FIG. 3 is a diagram illustrating an operation example of a 6-bit hybrid ADC consisting of a 3-bit SAR coarse ADC and a 4-bit digital slope fine ADC according to an embodiment of the present invention.

FIG. 3 is a diagram illustrating an operation example of a 6-bit hybrid ADC consisting of a 3-bit SAR coarse ADC and a 4-bit digital slope fine ADC according to an embodiment of the present invention. In this example, an ADC output of the 4-bit digital slope fine ADC has one bit redundancy overlapped with an ADC output of the 3-bit SAR coarse ADC. After the 3-bit SAR conversion applied to the input voltage $V_{IN}$ is done, a 3-bit coarse ADC output "010" is obtained, and the residue voltage converges to the range [−$V_{max}$/8, +$V_{max}$/8]. Next, the residue voltage is level-shifted to a middle half range of the full range [0, +$V_{max}$/2] for the following 4-bit digital slope conversion. After the residue voltage is well-settled, the residue voltage is switched down one LSB by one LSB. When the residue voltage is found smaller than zero, the comparator output Valid of the continuous-time comparator will rise from a logic low level "0" to a logic high level "1" and stop the digital slope ADC. As shown in FIG. 3, an 8-LSB redundant range resulting from the level-shift operation will introduce an offset that needed to be compensated. Hence, the digital error correction circuit generates the final digital output $D_{OUT}$ by combining the ADC output $B_{S2}$-$B_{S0}$ of the 3-bit SAR coarse ADC and the 4-bit ADC output $B_{D3}$-$B_{D0}$ of the digital slope fine ADC with one bit overlapped with each other and subtracting the offset induced by the redundant range from the combination result. In this way, the final digital output $D_{OUT}$ "010010" is correctly generated.

Figure 4:
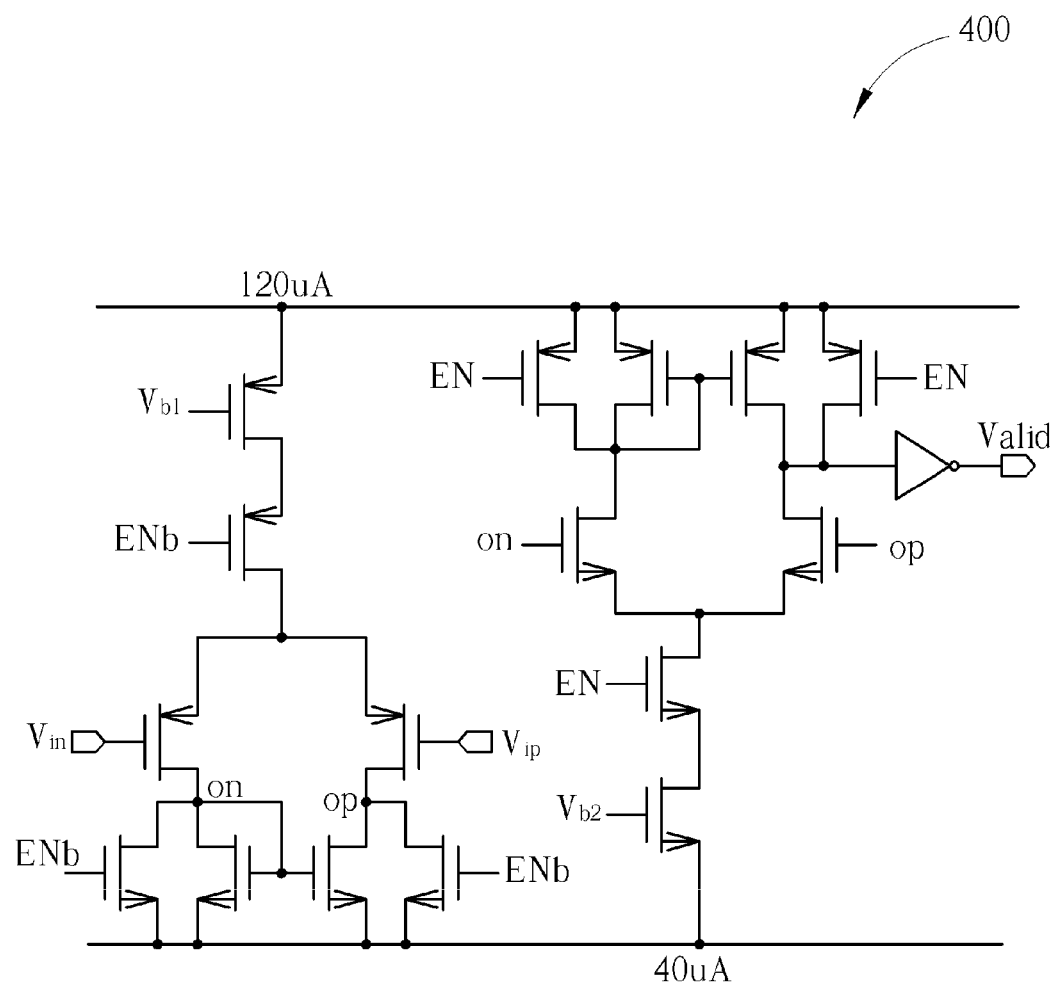
FIG. 4 is a circuit diagram of a continuous-time comparator according to an embodiment of the present invention.

The CT-CMP 224 shown in FIG. 2 may be properly designed to enable the digital slope ADC to have a higher resolution by time-domain interpolation without adding extra unit capacitors. FIG. 4 is a circuit diagram of a continuous-time comparator according to an embodiment of the present invention. By way of example, but not limitation, the CT-CMP 224 shown in FIG. 2 may be implemented using the proposed low-noise low-power continuous-time comparator 400 shown in FIG. 4. In this embodiment, the continuous-time comparator 400 is particularly designed with a very low bandwidth, which is much lower than the step frequency $$\left(\text{e.g.}, \frac{1}{100 \text{ ps}}\right)$$

of unit capacitor switching. The bandwidth-limited continuous-time comparator 400 is capable of filtering out high-frequency harmonics and noises of the switched-capacitor slope. Only the low-frequency components and noises are integrated to generate the comparator output Valid, thus resulting in a more linear switched-capacitor slope. In this way, the operation of using the switched-capacitor slope in the digital slope ADC is similar to discharging with a current source as used in a typical dual-slope ADC. Therefore, performing time-domain interpolation upon a digital slope conversion result derived from sequentially switching the capacitors $C_{D31}$-$C_{D0}$ in the first switched-capacitor sub-network 232 from the reference voltage Vref to the ground voltage GND can create more bits for improving the resolution of the digital slope ADC without adding extra unit capacitors to the digital slope ADC.

Figure 5:
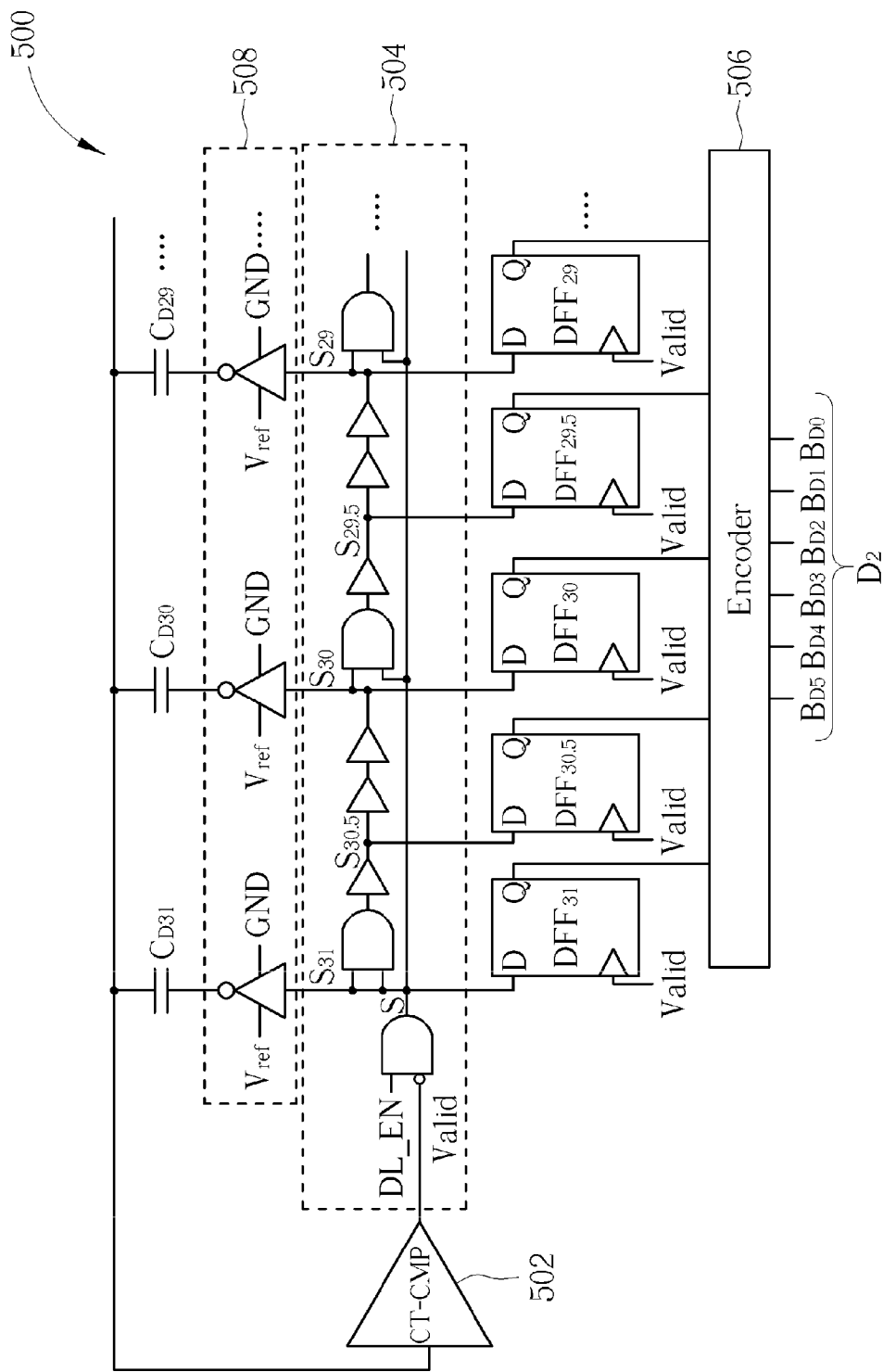
FIG. 5 is a diagram illustrating a 6-bit digital slope fine ADC with time-domain interpolation according to an embodiment of the present invention.

FIG. 5 is a diagram illustrating a 6-bit digital slope fine ADC with time-domain interpolation according to an embodiment of the present invention. The 6-bit digital slope fine ADC 500 includes a continuous-time comparator (denoted as "CT-CMP") 502, a delay line 504, an encoder (e.g., thermometer-to-binary encoder) 506, a switch circuit 508, a plurality of D-type flip-flops (e.g., $DFF_{31}$, $DFF_{30.5}$, $DFF_{30}$, $DFF_{29.5}$, $DFF_{29}$, etc.), and a plurality of unit capacitors (e.g., $C_{D31}$, $C_{D30}$, $C_{D29}$, etc.). By way of example, but not limitation, the digital slope fine ADC employed by the hybrid ADC 200 shown in FIG. 2 may be implemented using the 6-bit digital slope fine ADC 500 shown in FIG. 5. For example, the switch circuit 236 may be implemented using the switch circuit 508, the delay line 226 may be implemented using the delay line 504, the encoder 227 may be implemented using the encoder 506, and the CT-CMP 224 may be implemented using the CT-CMP 502.

At the beginning of the digital slope conversion procedure, the enable signal DL_EN is set to high (i.e., DL_EN="1") to enable the delay line 504. Each of the capacitor control signals (e.g., $S_{31}$, $S_{30}$, $S_{29}$, etc.) has a logic low level "0", such that the bottom plate of the corresponding unit capacitor is initially reset to the reference voltage Vref. At this moment, the zero-crossing of the residue voltage is not detected by the CT-CMP 502 yet, and the comparator output Valid is set to low (i.e., Valid="0"). In this way, the delay line 504 transmits a control signal S with a logic high level (i.e., S="1") to one switch within the switch circuit 508 at time T, and then transmits the same control signal S with the logic high level to the next switch within the switch circuit 508 at time T+dT, where dT is the delay time that defines the unit capacitor switching frequency. When the capacitor control signal $S_{31}$ is set by the control signal S with the logic high level at time T, the unit capacitor $C_{D31}$ is switched from the reference voltage Vref to the ground voltage GND. Similarly, when the zero-crossing of the residue is not detected by the CT-CMP 502 and the capacitor control signal $S_{30}$ is set by the control signal S with the logic high level at time T+1×dT, the unit capacitor $C_{D30}$ is switched from the reference voltage Vref to the ground voltage GND; and when the zero-crossing of the residue is not detected by the CT-CMP 502 and the capacitor control signal $S_{29}$ is set by the control signal S with the logic high level at time T+2×dT, the unit capacitor $C_{D29}$ is switched from the reference voltage Vref to the ground voltage GND.

The delay line 504 does not stop transmitting the control signal S with the logic high level until the zero-crossing of the residue voltage is detected by the CT-CMP 502. When the zero-crossing of the residue is detected by the CT-CMP 502, the comparator output Valid has a transition from a logic low level "0" to a logic high level "1", thus triggering the flip flops (e.g., $DFF_{31}$, $DFF_{30.5}$, $DFF_{30}$, $DFF_{29.5}$, $DFF_{29}$, etc.) to concurrently sample binary values of the instant capacitor control signals (e.g., $S_{31}$, $S_{30}$, $S_{29}$, etc.) and interpolated signals (e.g., $S_{30.5}$, $S_{29.5}$, etc.) and to output a thermometer code composed of the sampled binary values to the encoder 506. In this example, one interpolated signal is sampled between adjacent capacitor control signals of unit capacitors. Hence, a 63-bit thermometer code is generated to the encoder 506, and a 6-bit binary code is generated from a thermometer-to-binary conversion performed by the encoder 506. It should be noted that the bit number of the thermometer code fed into the encoder 506 is larger than the number of unit capacitors due to time-domain interpolation. More specifically, if the time-domain interpolation is not enabled, the bit number of the thermometer code fed into the encoder 506 will be equal to the number of unit capacitors. As a result, the encoder 506 converts a 32-bit thermometer code (which is composed of non-interpolated bits only) into a 5-bit binary code. However, if the time-domain interpolation is enabled, the encoder 506 converts a 64-bit thermometer code (which is composed of non-interpolated bits and interpolated bits) into a 6-bit binary code, thus improving the resolution of the digital slop ADC. With the time-domain interpolation, the LSB time step may be equivalent to 50 ps.

It should be noted that sampling one interpolated signal between adjacent capacitor control signals of unit capacitors is for illustrative purposes only, and is not meant to be a limitation of the present invention. In an alternative design, the resolution of the digital slop ADC may be further improved by sampling more than one interpolated signal between adjacent capacitor control signals of unit capacitors. This also falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:

1. A hybrid analog-to-digital converter (ADC) comprising:
   a plurality of analog-to-digital conversion circuits, arranged to generate a plurality of partial digital outputs for a same analog input, respectively, wherein the analog-to-digital conversion circuits comprise a digital slope ADC arranged to perform signal quantization in a time domain; and
   a combining circuit, arranged to combine the partial digital outputs generated from the analog-to-digital conversion circuits to generate a final digital output of the analog input.

2. The hybrid ADC of claim 1, wherein the analog-to-digital conversion circuits further comprise a successive approximation register (SAR) ADC.

3. The hybrid ADC of claim 2, wherein the SAR ADC is a coarse ADC arranged to determine most significant bits corresponding to the analog input, and the digital slope ADC is a fine ADC arranged to determine least significant bits corresponding to the analog input.

4. The hybrid ADC of claim 2, wherein there is no gain error between the SAR ADC and the digital slope ADC.

5. The hybrid ADC of claim 2, wherein analog-to-digital conversions performed by the SAR ADC and the digital slope ADC share a same switched-capacitor network.

6. The hybrid ADC of claim 5, wherein the switched-capacitor network comprises:
   a first switched-capacitor sub-network, coupled to a positive input terminal of a dynamic comparator of the SAR ADC and a positive input terminal of a continuous-time comparator of the digital slope ADC; and
   a second switched-capacitor sub-network, coupled to a negative input terminal of the dynamic comparator of the SAR ADC and a negative input terminal of the continuous-time comparator of the digital slope ADC.

7. The hybrid ADC of claim 6, wherein analog-to-digital conversion performed by the digital slope ADC is operated in a pseudo-differential mode.

8. The hybrid ADC of claim 7, wherein the first switched-capacitor sub-network comprises a plurality of first capacitors each having a same capacitance value; and the first capacitors are sequentially switched from a reference voltage to a ground voltage until the continuous-time comparator of the digital slope ADC detects zero crossing.

9. The hybrid ADC of claim 7, wherein the second switched-capacitor sub-network comprises a plurality of second capacitors each having a same capacitance value; and a portion of the second capacitors are switched from a reference voltage to a ground voltage at a beginning of the analog-to-digital conversion performed by the digital slope ADC.

10. The hybrid ADC of claim 1, wherein the digital slope ADC comprises:
    a continuous-time comparator;
    a switched-capacitor network, comprising:
    a plurality of capacitors, each having a same capacitance value and coupled to a same input terminal of the continuous-time comparator; and
    a delay line, arranged to transmit a control signal to sequentially switch the capacitors from a reference voltage to a ground voltage until the continuous-time comparator detects zero crossing; and
    an encoder, arranged to obtain a thermometer code read from the delay line and convert the thermometer code into a binary code when the continuous-time comparator detects the zero crossing, wherein a bit number of the thermometer code is larger than a number of the capacitors.

11. A hybrid analog-to-digital conversion method comprising:

performing a plurality of analog-to-digital conversions to generate a plurality of partial digital outputs for a same analog input, respectively, wherein the analog-to-digital conversions comprise a digital slope analog-to-digital conversion arranged to perform signal quantization in a time domain; and combining the partial digital outputs generated from the analog-to-digital conversions to generate a final digital output of the analog input.

12. The hybrid analog-to-digital conversion method of claim 11, wherein the analog-to-digital conversions further comprise a successive approximation register (SAR) analog-to-digital conversion.

13. The hybrid analog-to-digital conversion method of claim 12, wherein the SAR analog-to-digital conversion is a coarse analog-to-digital conversion arranged to determine most significant bits corresponding to the analog input, and the digital slope analog-to-digital conversion is a fine analog-to-digital conversion arranged to determine least significant bits corresponding to the analog input.

14. The hybrid analog-to-digital conversion method of claim 12, wherein there is no gain error between the SAR analog-to-digital conversion and the digital slope analog-to-digital conversion.

15. The hybrid analog-to-digital conversion method of claim 12, wherein the SAR analog-to-digital conversion and the digital slope analog-to-digital conversion share a same switched-capacitor network.

16. The hybrid analog-to-digital conversion method of claim 15, wherein the switched-capacitor network comprises:
a first switched-capacitor sub-network, coupled to a positive input terminal of a dynamic comparator used by the SAR analog-to-digital conversion and a positive input terminal of a continuous-time comparator used by the digital slope analog-to-digital conversion; and
a second switched-capacitor sub-network, coupled to a negative input terminal of the dynamic comparator used by the SAR analog-to-digital conversion and a negative input terminal of the continuous-time comparator used by the digital slope analog-to-digital conversion.

17. The hybrid analog-to-digital conversion method of claim 16, wherein the digital slope analog-to-digital conversion is operated in a pseudo-differential mode.

18. The hybrid analog-to-digital conversion method of claim 17, wherein the first switched-capacitor sub-network comprises a plurality of first capacitors each having a same capacitance value; and the first capacitors are sequentially switched from a reference voltage to a ground voltage until the continuous-time comparator used by the digital slope analog-to-digital conversion detects zero crossing.

19. The hybrid analog-to-digital conversion method of claim 17, wherein the second switched-capacitor sub-network comprises a plurality of second capacitors each having a same capacitance value; and a portion of the second capacitors are switched from a reference voltage to a ground voltage at a beginning of the digital slope analog-to-digital conversion.

20. The hybrid analog-to-digital conversion method of claim 11, wherein the digital slope analog-to-digital conversion comprises:
utilizing a continuous-time comparator;
utilizing a switched-capacitor network, comprising:
a plurality of capacitors, each having a same capacitance value and coupled to a same input terminal of the continuous-time comparator; and
utilizing a delay line to transmit a control signal for sequentially switching the capacitors from a reference voltage to a ground voltage until the continuous-time comparator detects zero crossing; and
when the continuous-time comparator detects the zero crossing, obtaining a thermometer code read from the delay line and converting the thermometer code into a binary code, wherein a bit number of the thermometer code is larger than a number of the capacitors.

\* \* \* \* \*